(12) United States Patent  
Chen

(10) Patent No.: US 10,872,801 B2  
(45) Date of Patent: Dec. 22, 2020

(54) TARGET SUBSTRATE WITH MICRO SEMICONDUCTOR STRUCTURES

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 0 days.

(21) Appl. No.: 16/121,945

(22) Filed: Sep. 5, 2018

(65) Prior Publication Data

US 2019/0074206 A1 Mar. 7, 2019

(30) Foreign Application Priority Data

Sep. 6, 2017 (TW) .............................. 106130516 A

(51) Int. Cl.
| | |
|---|---|
| *H01L 21/683* | (2006.01) |
| *H01L 25/075* | (2006.01) |
| *B65G 47/90* | (2006.01) |
| *H01L 33/62* | (2010.01) |

(52) U.S. Cl.
CPC .......... *H01L 21/6835* (2013.01); *B65G 47/90* (2013.01); *H01L 25/0753* (2013.01); *H01L 33/62* (2013.01); *H01L 2221/68354* (2013.01); *H01L 2221/68363* (2013.01); *H01L 2221/68368* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 2017/0048976 A1* | 2/2017 | Prevatte | H05K 3/3436 |
| 2017/0207193 A1* | 7/2017 | Bower | H01L 24/83 |
| 2017/0256521 A1* | 9/2017 | Cok | H01L 25/165 |
| 2018/0286734 A1* | 10/2018 | Meitl | H01L 21/6835 |
| 2019/0006564 A1* | 1/2019 | Sasaki | H01L 21/6835 |
| 2019/0259728 A1* | 8/2019 | Hwangbo | H01L 24/13 |

* cited by examiner

*Primary Examiner* — Nduka E Ojeh
(74) *Attorney, Agent, or Firm* — Muncy, Geissler, Olds & Lowe, P.C.

(57) ABSTRACT

A target substrate with micro semiconductor structures is manufactured by following steps of: attaching a pre-adhesive layer on a target substrate; patterning the adhesive layer to form a plurality of micro contact protrusions; and using the target substrate to perform a selective batch pickup procedure to pick up a plurality of micro semiconductor structures so as to form the target substrate with micro semiconductor structures.

20 Claims, 16 Drawing Sheets

TARGET SUBSTRATE WITH MICRO SEMICONDUCTOR STRUCTURES

CROSS REFERENCE TO RELATED APPLICATIONS

This Non-provisional application claims priority under 35 U.S.C. § 119(a) on Patent Application No(s). 106130516 filed in Taiwan, Republic of China on Sep. 6, 2017, the entire contents of which are hereby incorporated by reference.

BACKGROUND

Technology Field

The present disclosure relates to a target substrate with micro semiconductor structures and, in particular, to a target substrate containing micro semiconductor structures, which are disposed by batch transferring.

Description of Related Art

In practice, the transferring of huge amount of micro LEDs encounters some technical thresholds and restrictions. In the conventional manufacturing process of LED (having a length over 100 micrometers), a plurality of individually independent and arrayed LED dies are manufactured by a series processes (e.g. half cutting (electrical insulation), testing, and full cutting) after the epitaxial process. Then, a pick-up head is used to select and transfer the LED dies one by one to a carrier substrate. However, in the micronization of LEDs, for example, the edge length of the micro LED die is relatively smaller (e.g. 100 micron or less), so the pick-up head, which has limitation in scale minimization, cannot effectively pick up the micro LED dies. For another example, the micronization of the die size means that the number of LED dies fabricated by the same sized wafer can be greatly increased. Unfortunately, the conventional process of picking and transferring the LED dies one by one cannot meet the needs of huge amount of manufactured LED dies and will result in a very low yield.

In the industry, the micro contact printing technology has been applied to form a huge number of concave and convex patterns on the polymer material plate for correspondingly picking the micro LED dies. This method can achieve the requirement of transferring a huge number of micro LED dies. However, in practice, the polymer material plate must has both of the properties of high hardness and adhesiveness so that it can remain the original shape (without deformation) during the repeated picking up steps.

Therefore, it is desired to develop an effective and novel technology for transferring a huge amount of workpieces.

SUMMARY

In view of the foregoing, the present disclosure is to provide a target substrate with micro semiconductor structures, which is to form patterned micro contact protrusions on a target substrate for performing a selective batch pickup procedure to pick up a plurality of micro semiconductor structures.

To achieve the above, the present disclosure provides a target substrate with micro semiconductor structures. The target substrate comprises a target substrate, a plurality of micro semiconductor structures, and a plurality of micro contact protrusions. The target substrate has a substrate body and a plurality of conductive portions disposed on the substrate body. The micro semiconductor structures are patternedly disposed on the target substrate. Each of the micro semiconductor structures comprises a main body and at least an electrode disposed on the main body, and each of the electrodes is eutectic bonded with corresponding one of the conductive portions of the target substrate. The micro contact protrusions connect the main bodies of the patterned micro semiconductor structures to the substrate body of the target substrate.

To achieve the above, the present disclosure also provides a target substrate with micro semiconductor structures. The target substrate comprises a target substrate, a plurality of micro semiconductor structures disposed on the target substrate, and a first connecting element and a second connecting element connecting the micro semiconductor structures to the target substrate. The target substrate has a substrate body and a plurality of conductive portions disposed on the substrate body, and each of the micro semiconductor structures comprises a main body and at least an electrode disposed on the main body. The first connecting element is formed for eutectic bonding the electrode of each of the micro semiconductor structures with corresponding one of the conductive portions of the target substrate. The second connecting element connects the main bodies of the micro semiconductor structures to the substrate body of the target substrate, and the second connecting element is formed by at least a micro contact protrusion.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

A method of batch transferring micro semiconductor structures of this disclosure is used to pick up array-type micro-scaled structures/devices in batch and integrate them on to a non-native substrate without damaging the structures/devices. The present disclosure will be apparent from the following detailed description, which proceeds with reference to the accompanying drawings, wherein the same references relate to the same elements.

In the following, the terms "semiconductor structure" and "semiconductor device" are synonyms generally referring to a semiconductor material, die, structure, device, component of a device, or semi-finished product. The term "micro" of micro semiconductor structures and micro semiconductor devices generally refers to microscales. Semiconductor devices include high-quality monocrystalline semiconductors and polycrystalline semiconductors, semiconductor materials fabricated by high temperature processing, doped semiconductor materials, organic and inorganic semiconductors, and combinations of semiconductor materials and structures having one or more additional semiconductor components or non-semiconductor components (such as dielectric layers or materials, or conductive layers or materials). Semiconductor devices include, but are not limited to, transistors, photovoltaic devices including solar cells, diodes, light-emitting diodes, laser diodes, p-n junction diodes, photodiodes, integrated circuits, and sensors. In addition, a semiconductor device may refer to a component or portion of a functional semiconductor device or product.

In the following, the term "target substrate" refers to a non-native substrate for receiving the "micro semiconductor structures", which can be the temporary substrate during the manufacturing process or the finalized substrate after the entire manufacturing process. The material of the native substrate or non-native substrate includes polymers, plastics, resins, polyimide, polyethylene naphthalate, polyethylene terephthalate, metal, foil, glass, flexible glass, semiconductor, sapphire, thin film transistor (TFT), or the likes.

For ease of understanding and explanation, the "micro semiconductor structure" used herein is exemplified by a semi-finished product of a plurality of micro semiconductor structures that has been formed with at least one epitaxial layer and has been defined. The "target substrate" as used herein is exemplified by a thin film transistor.

First Embodiment

FIGS. 1A and 2A to 2G are schematic diagrams showing the flow chart and most manufacturing process of the method of batch transferring micro semiconductor structures of this disclosure. Herein, the micro semiconductor structures have, for example, horizontal electrodes or flip-chip electrodes.

Figure 1A:
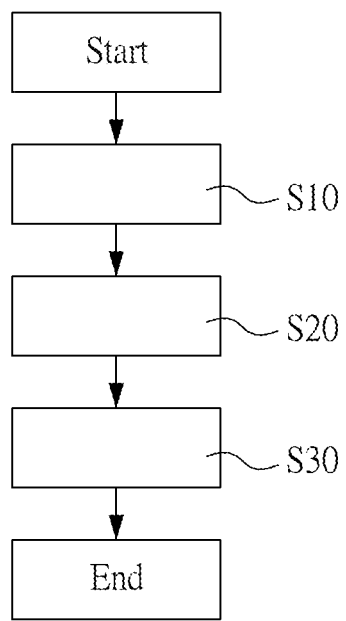
FIG. 1A is a flow chart of a method of batch transferring micro semiconductor structures according to a first embodiment of this disclosure.

As shown in FIG. 1A, the method of batch transferring micro semiconductor structures of this disclosure at least includes the following steps S10, S20 and S30.

The step S10 is to form a plurality of patterned micro contact protrusions 22 on a target substrate 10 as shown in FIGS. 2A to 2E.

The step S20 is to move a plurality of micro semiconductor structures 50 towards the target substrate 10, so that the micro contact protrusions 22 can adhere and pick up the partial corresponding micro semiconductor structures 50.

Figure 2A:
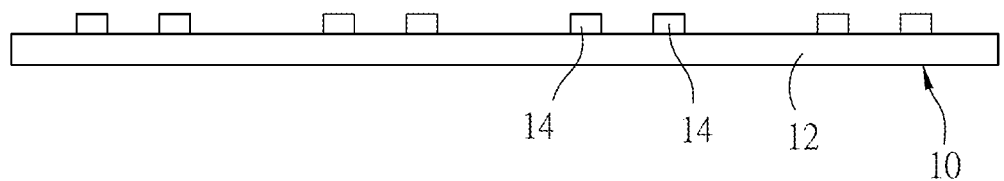
FIGS. 2A to 2H are schematic diagrams showing the manufacturing processes of FIGS. 1A and 1B.
Figure 2B:
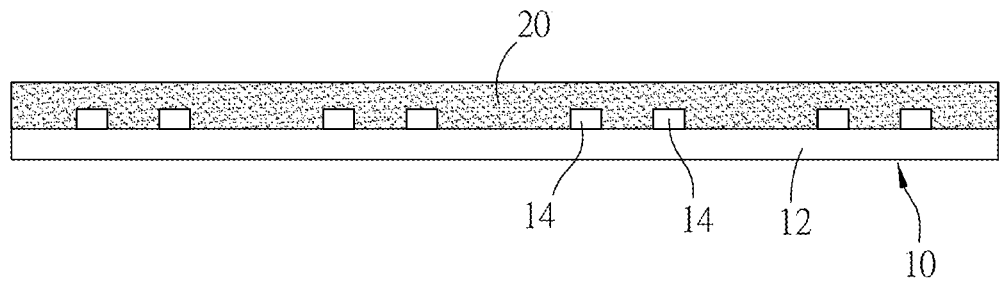
Figure 2C:
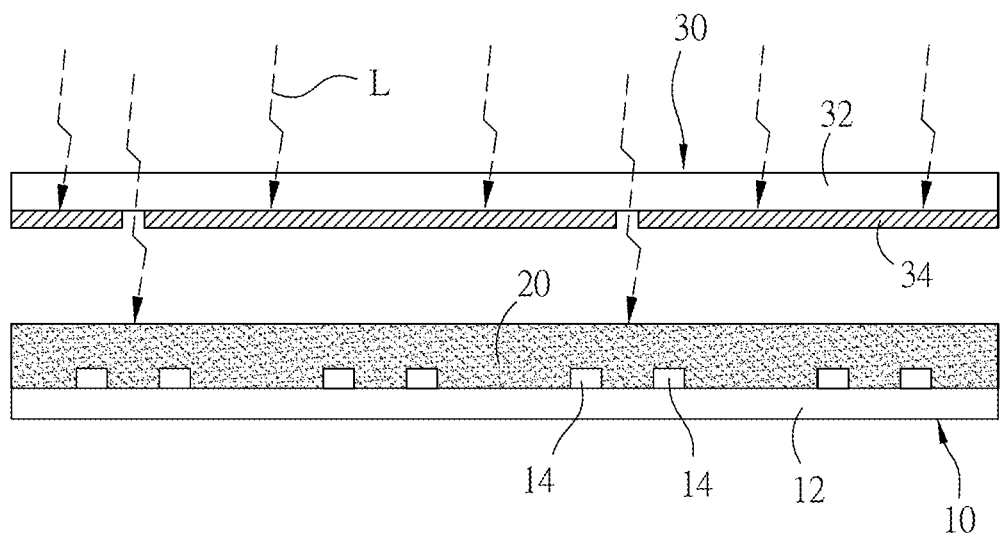
Figure 2D:
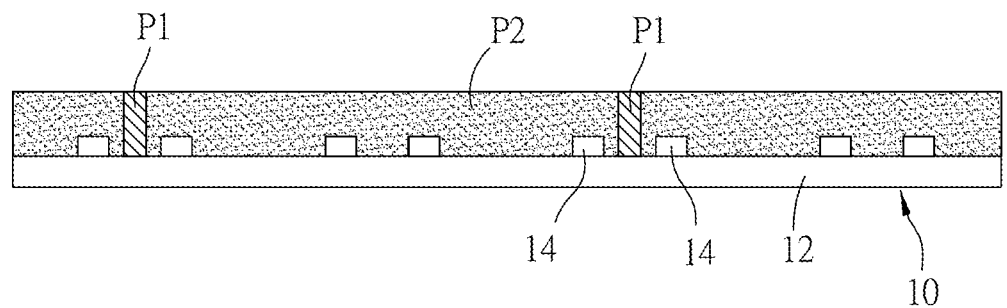
Figure 2E:
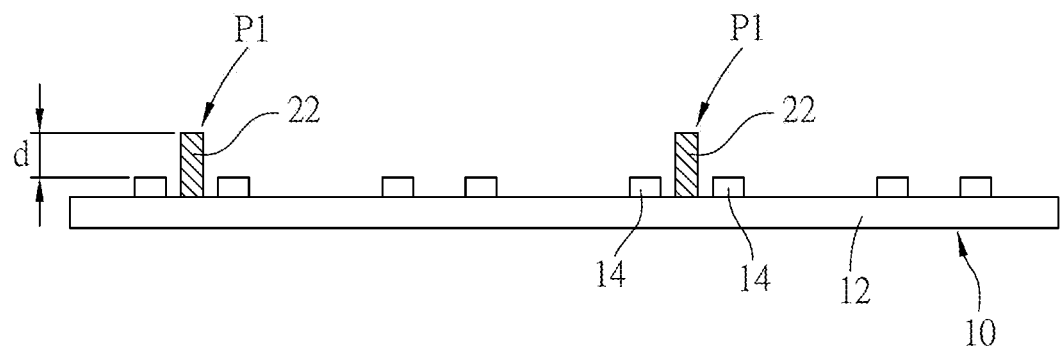
Figure 2F:
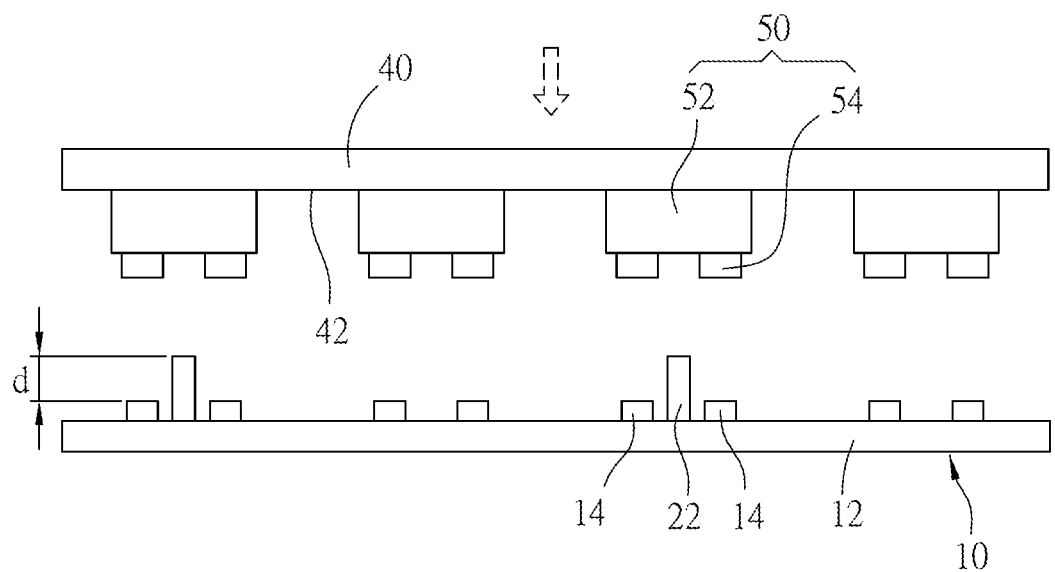
Figure 2G:
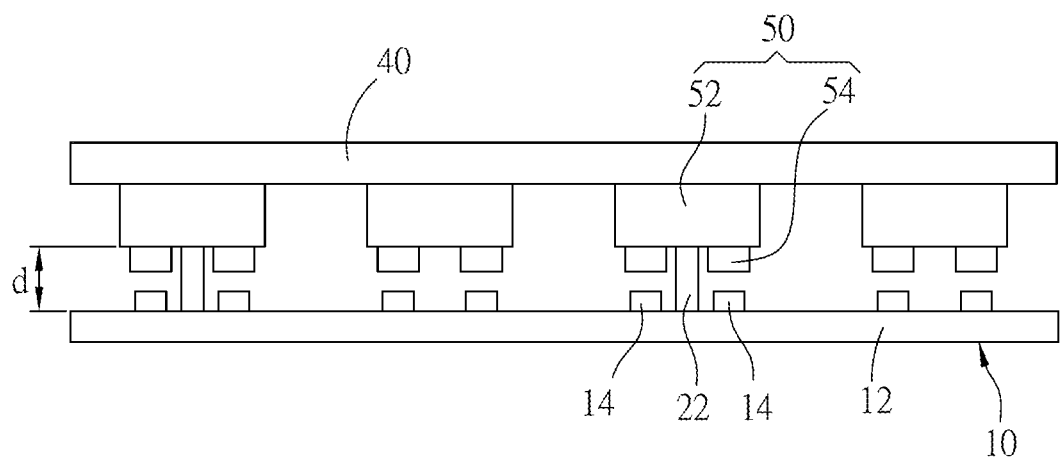
Figure 2H:
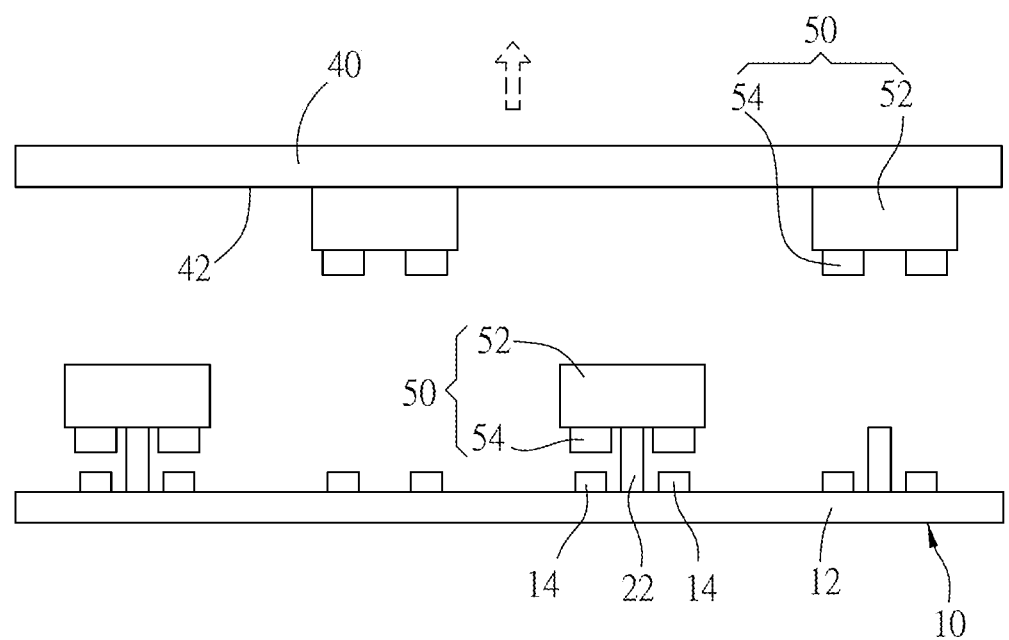

The step S30 is to remain the micro semiconductor structures 50 in the pattern and be fixed on the target substrate 10 as shown in FIG. 2H.

Second Embodiment

Figure 1B:
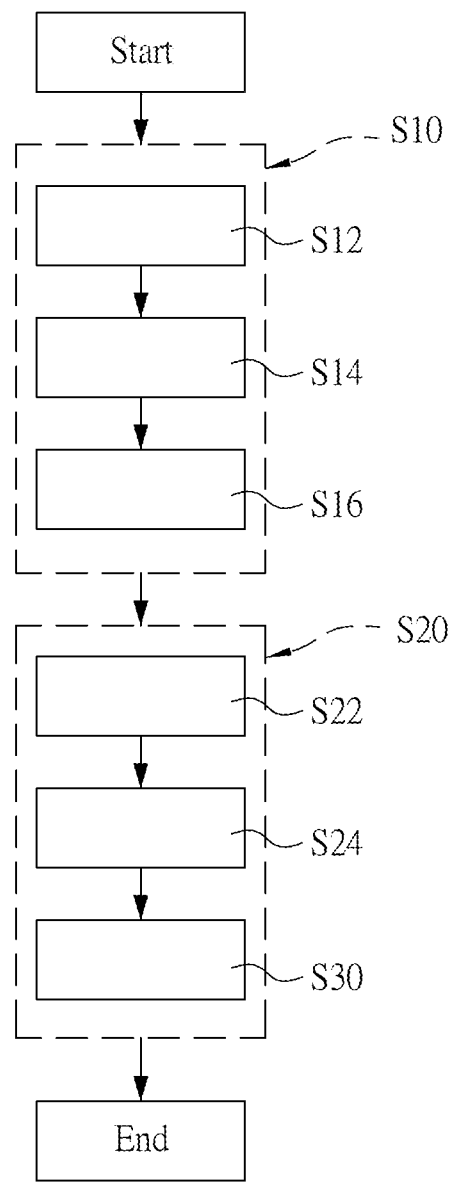
FIG. 1B is a flow chart of a method of batch transferring micro semiconductor structures according to a second embodiment of this disclosure.

The second embodiment is a more specific description of the first embodiment, and the flow of the second embodiment will be further described with reference to FIG. 1B.

As shown in FIGS. 2A to 2E, the Step S10 includes steps S12, S14 and S16.

The step S12 can be referred to FIGS. 2A and 2B. As shown in FIG. 2A, the target substrate 10 has a substrate body 12 and a plurality pairs of conductive portions 14 disposed on the substrate body 12. As shown in FIG. 2B, a pre-adhesive layer 20 is coated on the target substrate 10. Herein, the pre-adhesive layer 20 at least covers multiple of conductive portions 14, which can be used in the following processes. The pre-adhesive layer 20 can be, for example but not limited to, a positive or negative photoresist layer. In practice, the pre-adhesive layer 20 can be divided into a cured region P1 and a non-cured region P2 (see FIG. 3) by the etching and developing processes. In this disclosure, the pre-adhesive layer 20 is a positive photoresist layer, and this disclosure is not limited thereto.

Figure 3:
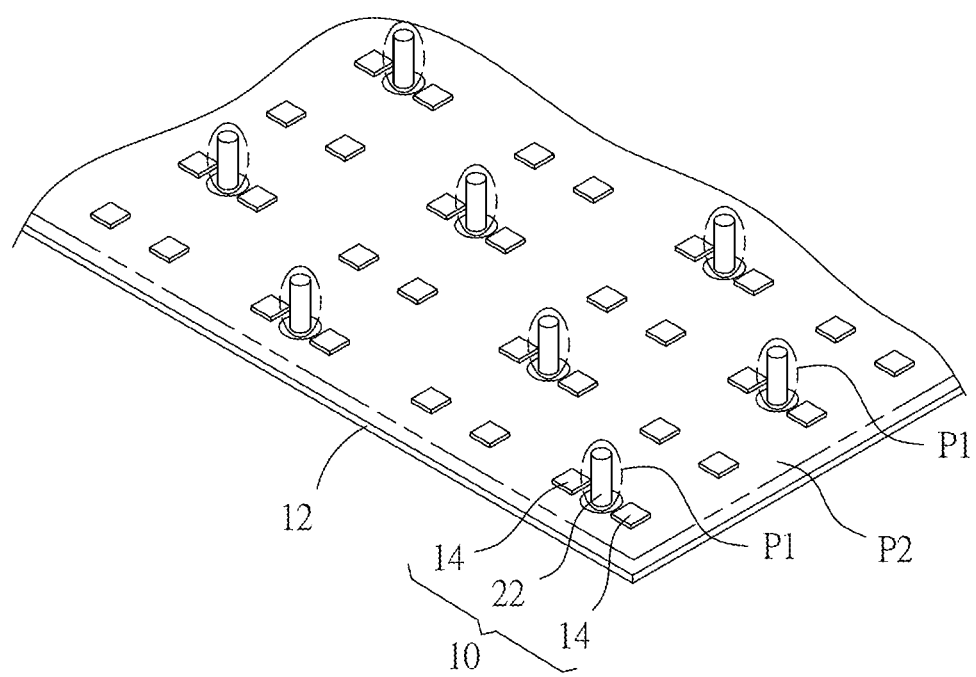
FIGS. 3 and 3A are schematic diagrams showing aspects different those shown in FIGS. 2D and 2E.

The step S14 can be referred to FIGS. 2C, 2D and 3. As shown in FIG. 2C, a mask member 30 is provided. The mask member 30 comprises a quartz substrate 32 and a patterned light shielding layer 34 disposed on the quartz substrate 32. The mask member 30 is placed above the target substrate 10 and the pre-adhesive layer 20, and a UV light L is provided to irradiate the pre-adhesive layer 20, so that the part of the pre-adhesive layer 20, which is not shielded by the light shielding layer 34, will be cured by the UV light L so as to form the cured region P1. On the contrary, the residual part of the pre-adhesive layer 20, which is not irradiated by the UV light L, is defined as the non-cured region P2. The cured region P1 and the non-cured region P2 can be referred to FIG. 3.

Figure 3A:
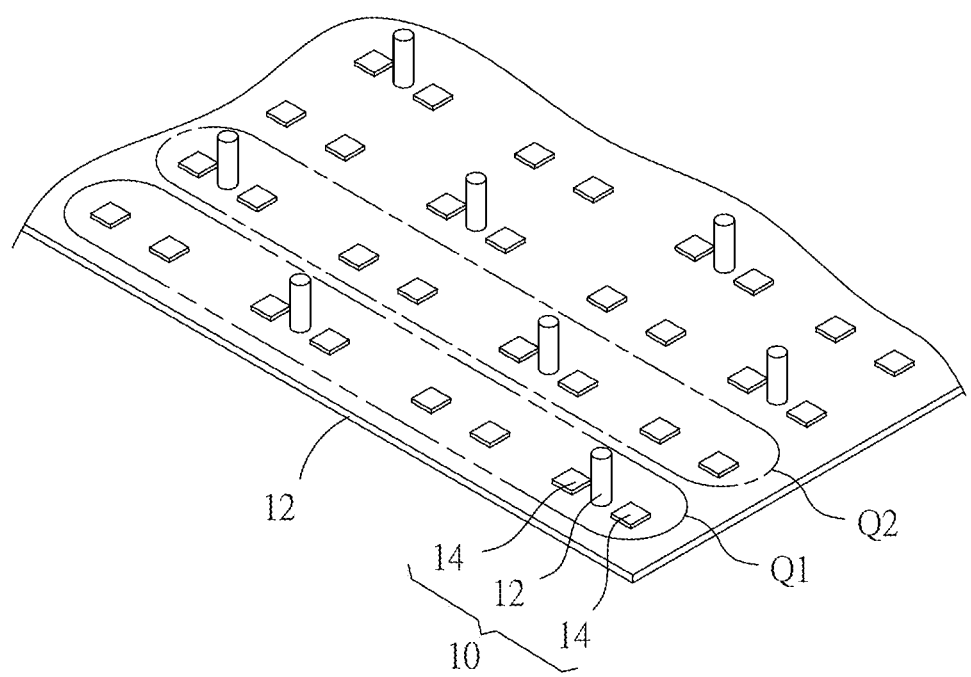
Figure 4:
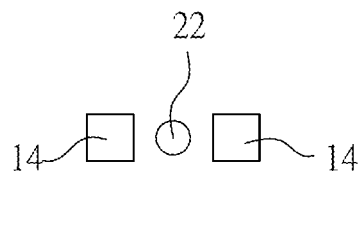
FIGS. 4 and 4A to 4I are schematic diagrams showing different aspects of the micro contact protrusions.

The step S16 can be referred to FIGS. 2E, 3A and 4. As shown in FIG. 2E, the non-cured region P2 of the pre-adhesive layer 20 is removed by the development process, so that a plurality of patterned micro contact protrusions 22 are remained on the target substrate 10. The micro contact protrusions 22 have adhesiveness. In this embodiment, the patterned micro contact protrusions 22 are disposed corresponding to a part of the conductive portions 14. In other words, each pair of the conductive portions 14 is disposed adjacent to at least one of the micro contact protrusions 22, or each of the micro contact protrusions 22 is disposed adjacent to the corresponding conductive portion 14. Herein, each micro contact protrusion 22 comprises, for example but not limited to, at least one convex point. In this embodiment, as shown in FIG. 4, a single convex point of one micro contact protrusion 22 is disposed between a correspond pair of conductive portions 14.

In this embodiment, the height of each micro contact protrusion 22 is greater than the height of each conductive portion 14, and each micro contact protrusion 22 and each conductive portion 14 have a height difference d as shown in FIG. 2E.

In this embodiment, the configuration of the micro contact protrusions 22 and the corresponding conductive portions 14 can be referred to, for example but not limited to, a first configuration Q1 and a second configuration Q2 as shown in FIG. 3A. The first configuration Q1 and the second configuration Q2 can be applied separately or together.

Figure 4C:
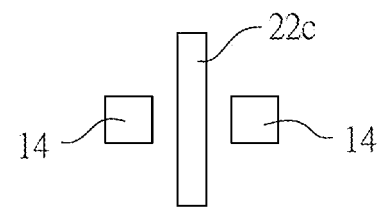
Figure 4A:
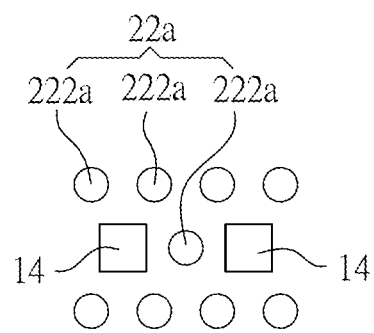
Figure 4D:
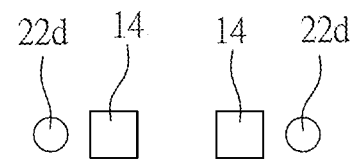
Figure 4B:
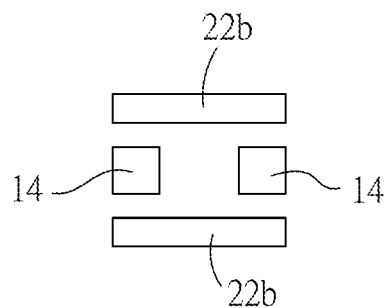
Figure 4E:
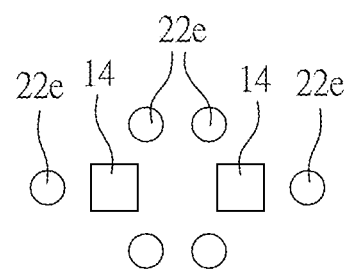
Figure 4F:
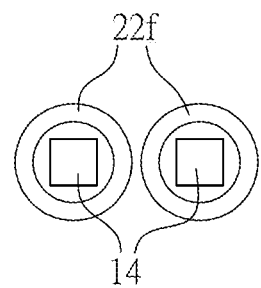
Figure 4H:
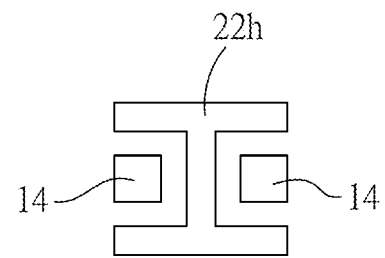
Figure 4G:
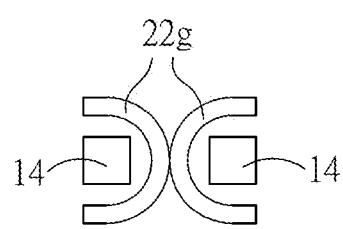
Figure 4I:
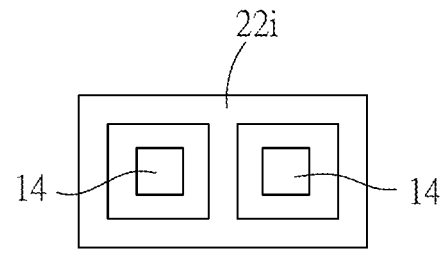

This disclosure provides various aspects of the micro contact protrusions corresponding to the pair of conductive portions 14. The mainly different of these aspects is that whether the distribution positions of the micro contact protrusions are located between the pair of conductive portions 14. For example, as shown in FIG. 4A, each micro contact protrusion 22a comprises a plurality of convex points 222a. The convex points 222a are discontinuous structures (e.g. separated structures) disposed around the pair of conductive portions 14, and one of the convex points 222a is disposed between the pair of conductive portions 14. For example, as shown in FIG. 4B, each of two micro contact protrusions 22b is a continuous structure, and they are parallel disposed at two sides of the corresponding pair of conductive portions 14. For example, as shown in FIG. 4C, one micro contact protrusion 22c is a continuous structure disposed between the corresponding pair of conductive portions 14. For example, as shown in FIG. 4D, each of two micro contact protrusions 22d is a convex point 222d, and they are disposed at two outer sides of the corresponding pair of conductive portions 14. For example, as shown in FIG. 4E, each of two micro contact protrusions 22e comprises a plurality of convex points 222e, which are discontinuous structures (e.g. separated structures) disposed around the pair of conductive portions 14. For example, as shown in FIG. 4F, each of two micro contact protrusions 22f is a continuous ring structure, and the micro contact protrusions 22f are disposed around the pair of conductive portions 14, respectively. For example, as shown in FIG. 4G, one micro contact protrusion 22g is a continuous structure extending outwardly from a point between the pair of conductive portions 14. For example, as shown in FIG. 4H, one micro contact protrusion 22h has an "I" shape disposed around the pair of conductive portions 14. The pattern of the micro contact protrusion 22h is similar to the convex points 222a disposed around the pair of conductive portions 14 as shown in FIG. 4A, but the micro contact protrusion 22h of FIG. 4H is a continuous structure. Of course, the micro contact protrusion 22h may be realized as the combination of the micro contact protrusions 22b of FIG. 4B and the micro contact protrusion 22c of FIG. 4C. Alternatively, the micro contact protrusion 22h may be realized as the modification of the micro contact protrusions 22g of FIG. 4G. For example, as shown in FIG. 4I, one micro contact protrusion 22i has an "8" shape disposed around the pair of conductive portions 14. The pattern of the micro contact protrusion 22i is similar to the micro contact protrusions 22f of FIG. 4F, which are now connected. Of course, the micro contact protrusion 22i may be realized as the combination of the micro contact protrusion 22 of FIG. 4 and the micro contact protrusions 22e of FIG. 4E, but the micro contact protrusion 22i of FIG. 4I is a continuous structure. The micro contact protrusions 22, 22a, 22c, 22f, 22g, 22h and 22i, which are disposed between the pair of conductive portions 14, can further provide the insulation effect for the pair of conductive portions 14. To be noted, the above-mentioned aspects of the micro contact protrusions are for illustrations only and are not to limit the scope of this disclosure.

As shown in FIGS. 2F and 2H, the step S20 comprises steps S22 and S24.

As shown in FIG. 2F, the step S22 is to move a plurality of micro semiconductor structures 50 towards the target substrate 10. The plurality of micro semiconductor structures 50 are carried on a carrying device 40. The carrying device 40 can support and move the micro semiconductor structures 50. In practice, the carrying device 40 can function by vacuum suction, static electric absorption, or the likes. In this embodiment, the carrying device 40 has a planar attaching surface 42 for example, but this disclosure is not limited thereto.

In this embodiment, the micro semiconductor structures 50 are adhered to the attaching surface 42. In practice, each micro semiconductor structure 50 has a main body 52 and a pair of electrodes 54 disposed on the main body 52. The micro semiconductor structures 50 are usually arranged in an array, and they can be individual micro LED final products, or individual micro LED semi-finished products.

In the step S24, as shown in FIG. 2G the patterned micro contact protrusions 22, which are disposed on the target substrate 10, contact and pick up a part of the micro semiconductor structures 50, which are carried on the carrying device 40, in batch. In other words, the micro semiconductor structures 50 are picked up in batch by the micro contact protrusions 22. Herein, at least one micro contact protrusion 22 contacts and picks up the main body 52 of one micro semiconductor structure 50, and the micro contact protrusion 22 does not interfere the electrodes 54 when picking up the main body 52 of the micro semiconductor structure 50. At this time, the electrodes 54 of each micro semiconductor structure 50 are usually not contacted with the corresponding conductive portions 14 of the target substrate 10.

As shown in FIG. 2H, the step S30 is to move the carrying device 40 away so that the micro semiconductor structures 50, which are picked up in batch by the micro contact protrusions 22, will be detached from the carrying device 40, and positioned on the target substrate 10 in the original pattern. In this embodiment, the adhesion between the micro contact protrusions 22 and the corresponding micro semiconductor structures 50 is greater than the adhesion between the carrying device 40 and the micro semiconductor structures 50, so that the patterned micro semiconductor structures 50 can detach from the carrying device 40. In this embodiment, the carrying device 40, which move away from the target substrate 10, still carries a plurality of remained micro semiconductor structures 50, which are not picked up by the micro contact protrusions 22. In addition, FIG. 2H shows that the carrying device 40 is moved away vertically, and this disclosure is not limited thereto.

Third Embodiment

Figure 1C:
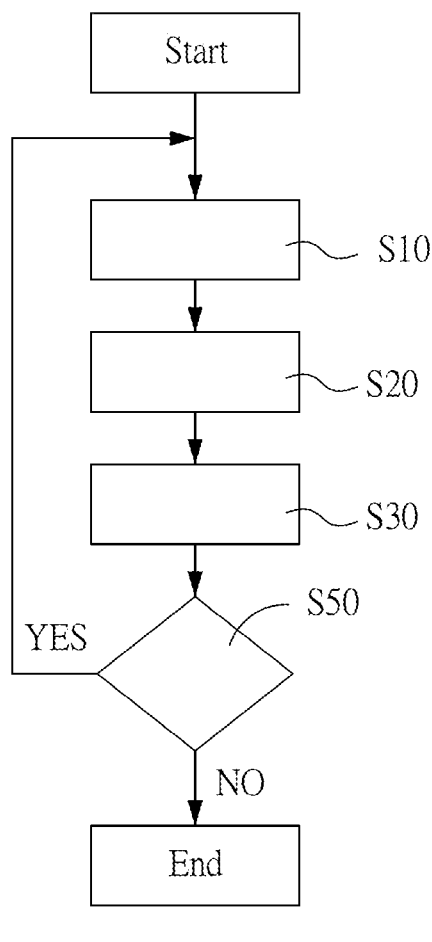
FIG. 1C is a flow chart of a method of batch transferring micro semiconductor structures according to a third embodiment of this disclosure.
Figure 2I:
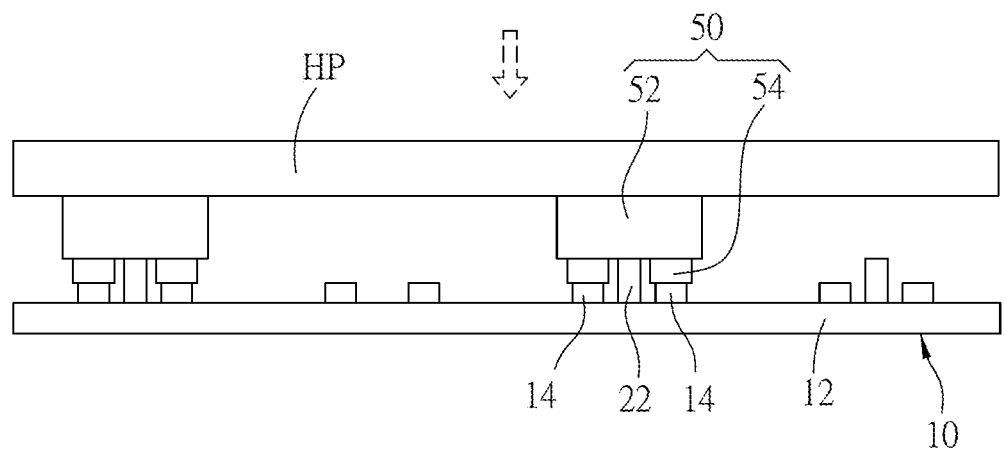
FIGS. 2I to 2J are schematic diagrams showing the third embodiment further comprises following procedures after the first and second embodiments.
Figure 2J:
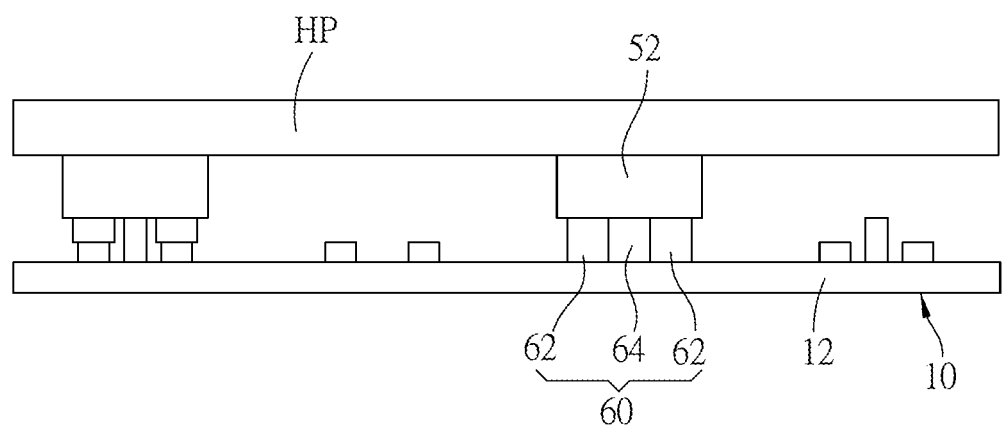

Referring to FIGS. 1C, 2I and 2J, the third embodiment further comprises some following procedures after the first and second embodiments.

This embodiment is to apply a predetermined treatment on the micro semiconductor structures remained on the target substrate, so that the conductive structures can be formed between the micro semiconductor structures and the conductive portions of the target substrate.

The step S40 is performed after the steps S10, S20 and S30, and comprises the steps S42 and S44 as shown in FIGS. 2I and 2J.

As shown in FIG. 2I, the step S42 is to provide a device HP for applying a predetermined treatment on the patterned micro semiconductor structures 50 remained on the target substrate 10, so that the electrodes 54 of the micro semiconductor structures 50 can contact with the corresponding conductive portions 14 of the target substrate 10. The micro contact protrusion 22, which pick up the main body 42 of the micro semiconductor structure 50, can fill between the main body 42 of the micro semiconductor structure 50 and the substrate body 12 of the target substrate 10. Then, the eutectic bonding can be applied to the electrodes 54 of the micro semiconductor structures 50 and the corresponding conductive portions 14, and the micro contact protrusions 22 can be solidified due to the applied high temperature. In this embodiment, the applied predetermined treatment can cause the eutectic bonding between the electrodes 54 and the corresponding conductive portions 14. The predetermined treatment can be hot pressing, ultrasonic hot melting, electromagnetic coil heating, or the likes. In this embodiment, the predetermined treatment is hot pressing, and this disclosure is not limited thereto.

Referring to FIG. 2J, the step S34 is to remove the device HP. In this case, a first connecting element 62 and a second connecting element 64 are provided to connect the micro semiconductor structures 50 to the target substrate 10. The first connecting element 62 and the second connecting element 64 can form a connecting structure 60 for connecting the micro semiconductor structures 50 to the target substrate 10. The first connecting element 62 is a structure formed by the eutectic bonding between the electrode 54 of the micro semiconductor structures 50 and the corresponding conductive portions 14 of the target substrate 10 for connecting the main bodies 52 of the micro semiconductor structures 50 to the substrate body 12 of the target substrate 10. The second connecting element 64 is a structure formed by the solidification of at least one micro contact protrusion 22 for connecting the main bodies 52 of the micro semiconductor structures 50 to the substrate body 12 of the target substrate 10.

To be noted, when the second connecting element 64 is configured between the pairs of electrodes 54 of the micro semiconductor structures 50, it can provide an insulation effect to the electrodes 54 of each micro semiconductor structure 50.

Fourth Embodiment

Referring to FIGS. 1D and 5A to 5C, the fourth embodiment is to perform the steps of the second embodiment and then repeat the steps S10, S20 and S30. The steps and components having similar instructions and functions have the same reference numbers of the first and second embodiments.

Figure 1D:
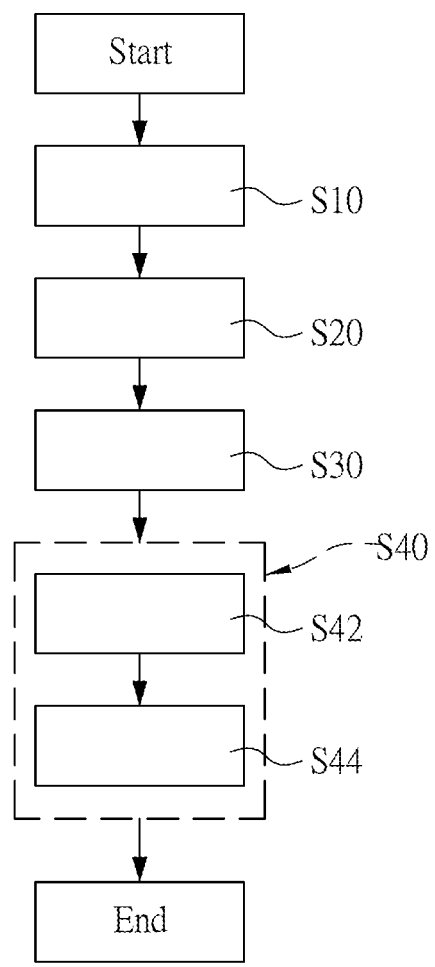
FIG. 1D is a flow chart of a method of batch transferring micro semiconductor structures according to a fourth embodiment of this disclosure.

As shown in FIG. 1D, the fourth embodiment finishes the steps S10, S20 and S30 of the first and second embodiments for patternedly picking up the micro semiconductor structures 50, and then performs a step S50 for determining whether to return the step S10. If yes, the procedure goes back the step S10 for patternedly picking up other micro semiconductor structures 50a. If no, the procedure is ended.

Figure 5A:
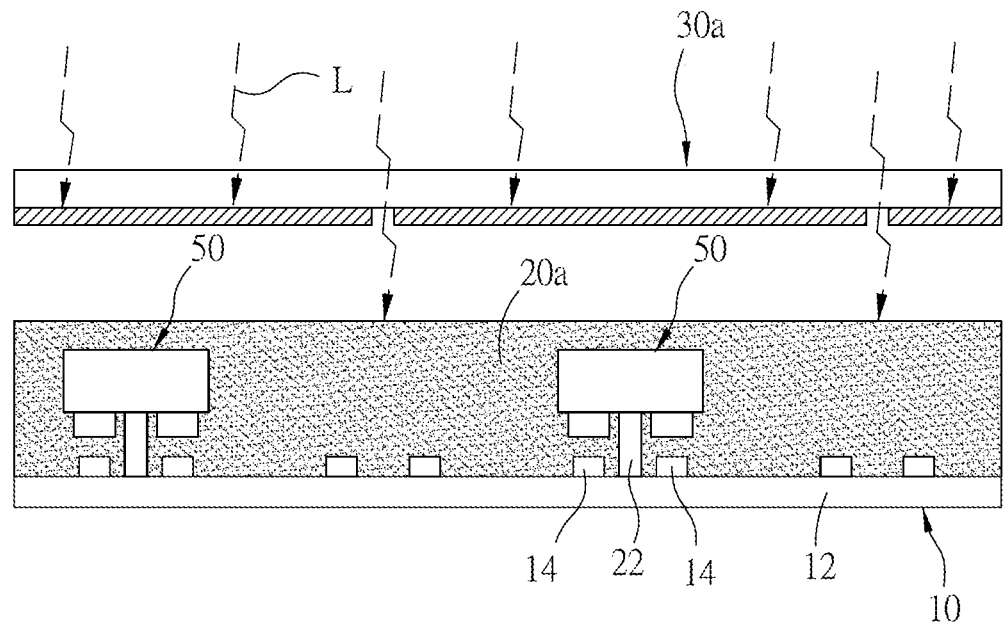
FIGS. 5A to 5C are schematic diagrams showing the manufacturing process of FIG. 1D.
Figure 5B:
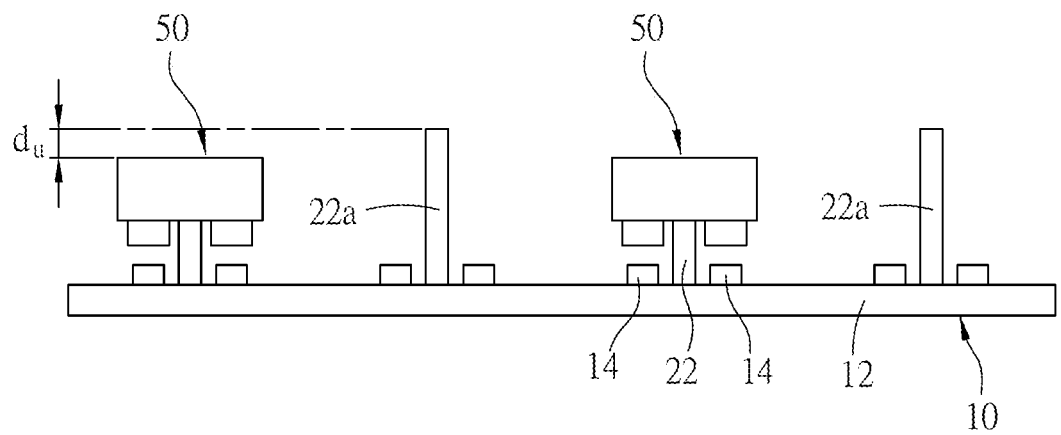

As shown in FIG. 5A, the step S10 is performed again to coat another pre-adhesive layer 20a on the target substrate 10, which is configured with a plurality of patterned micro semiconductor structures 50. In this embodiment, the pre-adhesive layer 20a is, for example, a positive photoresist. The same mask member 30 or another mask member 30a is provided, and the UV light L irradiates the pre-adhesive layer 20a to cure a part of the pre-adhesive layer 20a. As shown in FIG. 5B, the non-cured region of the pre-adhesive layer 20a is removed by the development process, so that a plurality of patterned micro contact protrusions 22a are remained on the target substrate 10. In this embodiment, the micro contact protrusions 22a is taller than the previous micro semiconductor structures 50, and they have a height difference $d_u$.

Figure 5C:
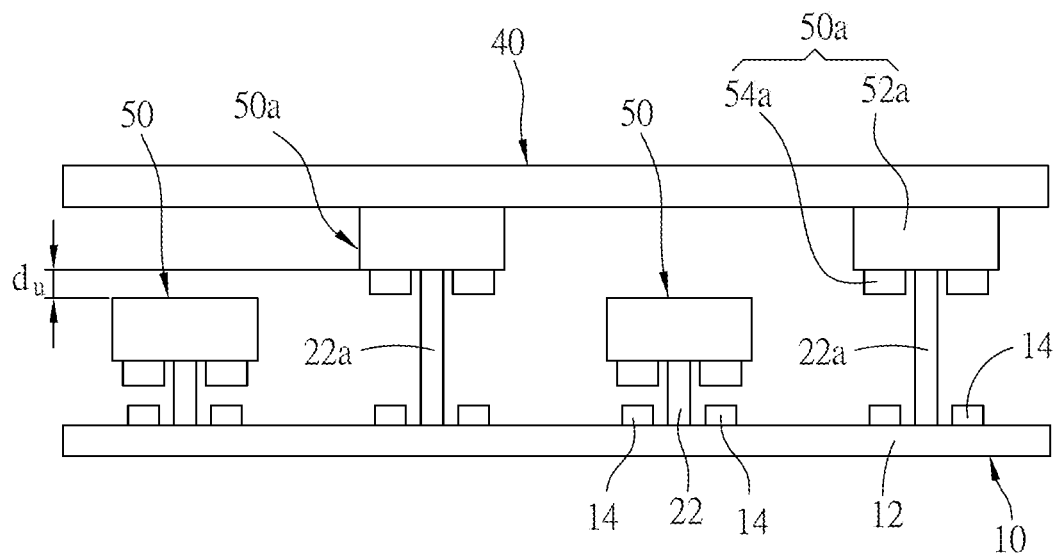

Referring to FIG. 5C, the steps S20 and S30 are performed again. Herein, the carrying device 40 can provide the remained micro semiconductor structures 50, which are not picked up in the previous procedure, or provide another batch of micro semiconductor structures 50a towards the target substrate 10. In this embodiment, the carrying device 40 provides another batch of micro semiconductor structures 50a, and then the micro contact protrusions 22a of the target substrate 10 can pick up the micro semiconductor structures 50a in batch. To be noted, the carrying device 40 does not interfere the patterned micro semiconductor structures 50, which have already disposed on the target substrate 10.

Fifth Embodiment

Figure 1E:
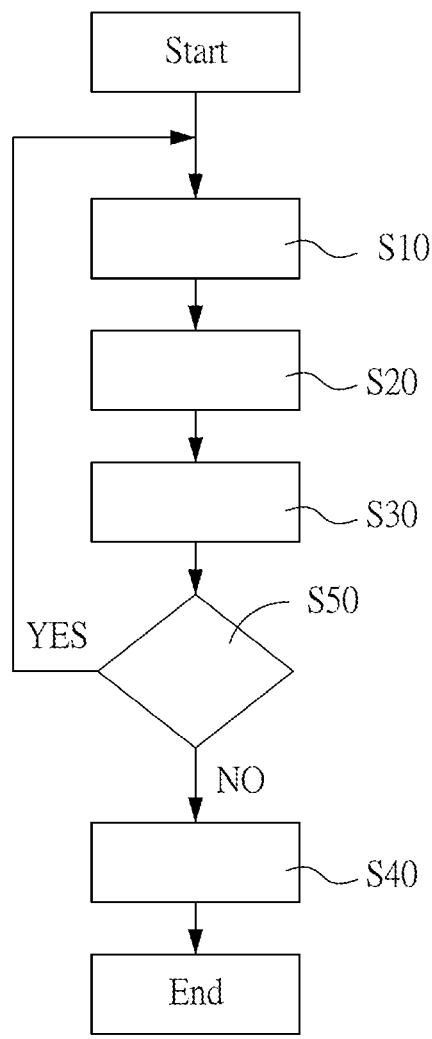
FIG. 1E is a flow chart of a method of batch transferring micro semiconductor structures according to a sixth embodiment of this disclosure.
Figure 5D:
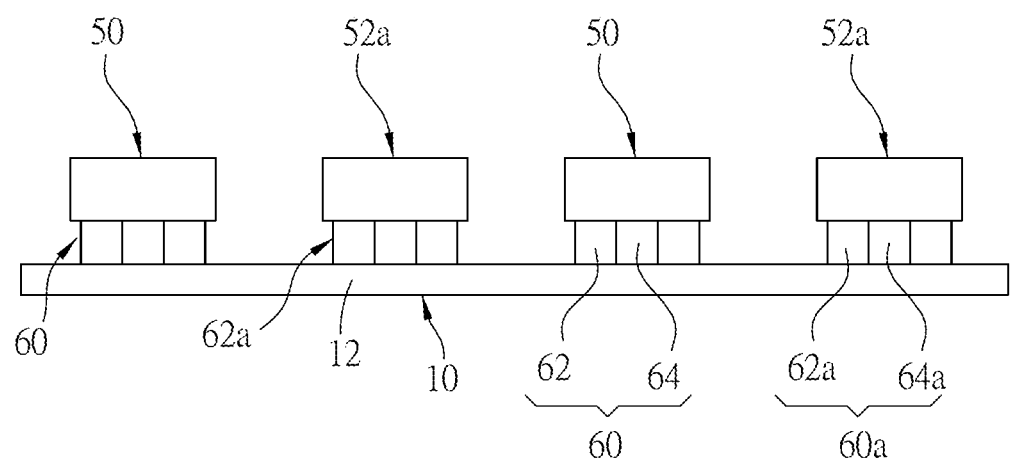
FIG. 5D is schematic diagram showing the step S40 in the fifth embodiment after finishing the steps of the third embodiment.

Referring to FIGS. 1E and 5D, the fifth embodiment is to perform the step S40 after finishing the steps of the third embodiment. The steps and components having similar instructions and functions have the same reference numbers of the third and fourth embodiments.

As shown in FIG. 5D, the step S40 is to apply a predetermined treatment on the target substrate 10, which is configured with the micro semiconductor structures 50 and 50a in the fourth embodiment. Accordingly, the eutectic bonding can be performed between the conductive portions 14 and the corresponding electrodes 54 and 54a, thereby forming the first connecting elements 62 and 62a. In addition, the micro contact protrusions 22 and 22a can form the second connecting elements 64 and 64a.

Sixth Embodiment

Figure 1F:
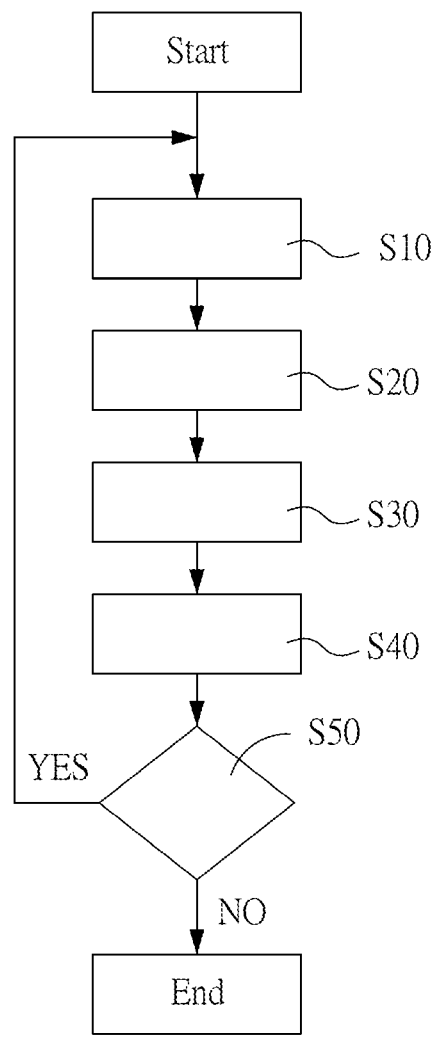
FIG. 1F is a flow chart of a method of batch transferring micro semiconductor structures according to a fifth embodiment of this disclosure.

Referring to FIG. 1F, the sixth embodiment is to perform the steps of the third embodiment and then repeat the steps S10, S20, S30 and S40. The steps and components having similar instructions and functions have the same reference numbers of the first, second and third embodiments.

The sixth embodiment further performs the step of patternedly picking up the micro semiconductor structures in batch with the target substrate, which is configured with the eutectic bonding micro semiconductor structures, and performs a predetermined treatment to form the eutectic bonding structures.

As shown in FIG. 1F, after finishing the steps S20, S30 and S40, the patterned micro semiconductor structures configured on the target substrate are all eutectic bonding with the target substrate, and then a step S50 is performed for determining whether to return the step S10. If yes, the procedure goes back the step S10 for performing the following steps S20, S30 and S40 again. If no, the procedure is ended.

Seventh Embodiment

Referring to FIGS. 1D and 6A to 6D, the seventh embodiment can be referred to the fourth embodiment but provide different attaching surface. The steps and components having similar instructions and functions have the same reference numbers of the first, second and fourth embodiments.

As shown in FIG. 1D, the seventh embodiment finishes the steps S10, S20 and S30 of the first and second embodiments for patternedly picking up the micro semiconductor structures 50, and then performs a step S50 for determining whether to return the step S10. If yes, the procedure goes back the step S10 for patternedly picking up other micro semiconductor structures 50b. If no, the procedure is ended.

Figure 6A:
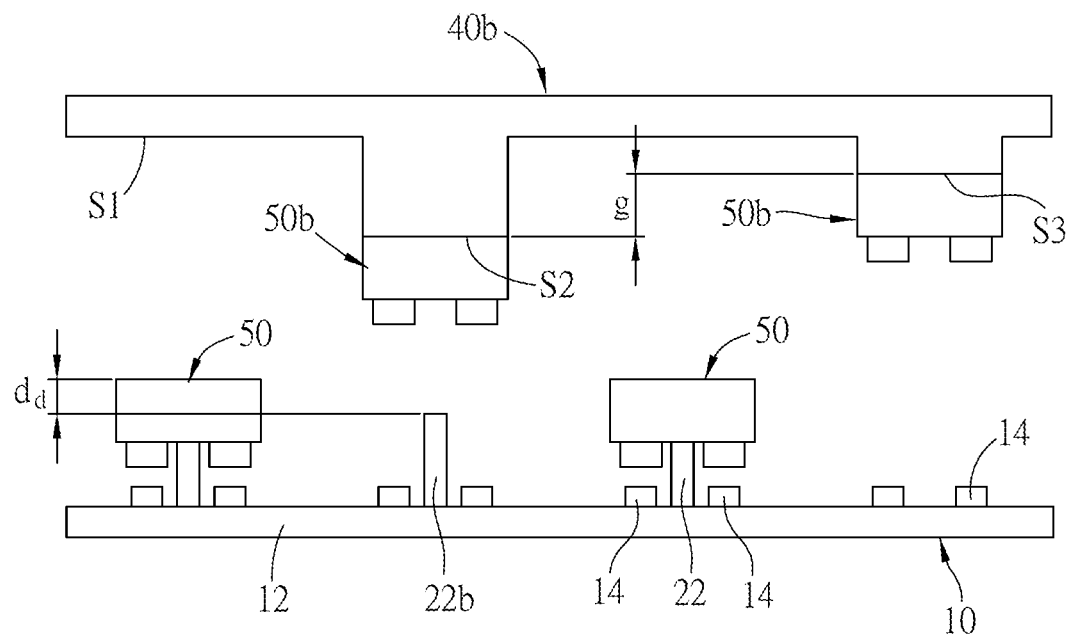
FIGS. 6A to 6D are schematic diagrams showing the manufacturing process of a method of batch transferring micro semiconductor structures according to a seventh embodiment of this disclosure.

As shown in FIG. 6A, the step S10 is performed to form a next batch of pre-adhesive layer 20b on the target substrate 10, which is configured with a plurality of patterned micro semiconductor structures 50. At this time, the patterned micro contact protrusions 22 of the target substrate 10 have already picked up the corresponding micro semiconductor structures 50 in batch. In this embodiment, the micro contact protrusions 22b is allowed to be shorter than the micro semiconductor structures 50, which are positioned on the target substrate 10, and they have a height difference $d_d$.

In addition, a carrying device 40b has attaching surfaces S1, S2 and S3, which have different depths. In this embodiment, the attaching surfaces S2 and S3 have a depth gap g, and the attaching surfaces S1, S2 and S3 attach a plurality of micro semiconductor structures 50b, which are arranged in a patterned array. In general, each of the attaching surfaces S1, S2 and S3 is configured with an individual patterned array for attaching a group or a kind of micro semiconductor structures. For example, the first attaching surface S1 can attach the blue micro LED structures, the second attaching surface S2 can attach the red micro LED structures, and the third attaching surface S3 can attach the green micro LED structures. In this embodiment, the attaching surfaces S2 and S3 can attach the same kind of micro semiconductor structures 50b.

Figure 6B:
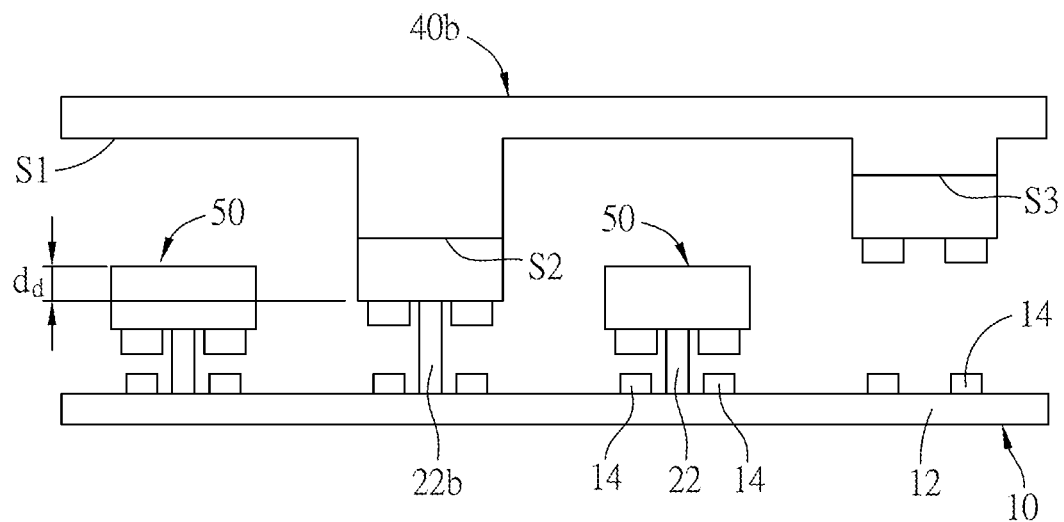

Referring to FIG. 6B, the step S20 is performed. Herein, the carrying device 40b, which carries the micro semiconductor structures 50b, is moved towards the target substrate 10, so that the patterned micro contact protrusions 22b, which are disposed on the target substrate 10, can contact and pick up the micro semiconductor structures 50b disposed on the attaching surface S2 of the carrying device 40 in batch. At this time, the micro semiconductor structures 50b disposed on the attaching surface S3 of the carrying device 40 do not contact the micro contact protrusions 22b of the target substrate 10.

Then, the step S30 is performed to move the carrying device 40b away. The micro semiconductor structures 50b, which are picked up by the micro contact protrusions 22b, can remain the original pattern and positioned on the target substrate 10. The micro semiconductor structures 50b disposed on the attaching surface S3 will be moved away from the target substrate 10 along with the carrying device 40.

Then, the step S50 is performed for determining whether to return the step S10. If yes, the procedure goes back the step S10 for performing the step of patternedly picking up the residual micro semiconductor structures 50b in batch. If no, the procedure is ended.

Figure 6C:
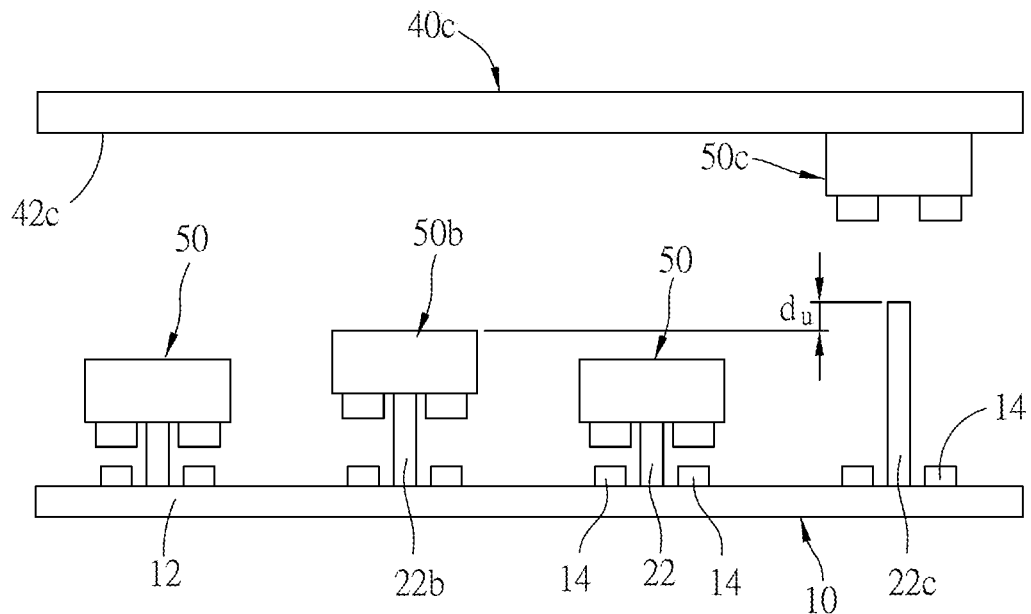

As shown in FIG. 6C, the step S10 is repeated for forming a next batch of micro contact protrusions 22c on the target substrate 10, which has been formed with the patterned micro semiconductor structures 50 and 50b. At this time, the patterned micro contact protrusions 22 and 22b of the target substrate 10 have already picked up the corresponding micro semiconductor structures 50 and 50b in batch. In this embodiment, the micro contact protrusions 22c is allowed to be taller than the micro semiconductor structures 50b, which are positioned on the target substrate 10, and they have a height difference $d_u$. This configuration can match the carrying device 40c, which has a planar attaching surface 42c. The plurality of micro semiconductor structures 50c are disposed on the attaching surface 42c of the carrying device 40c.

Figure 6D:
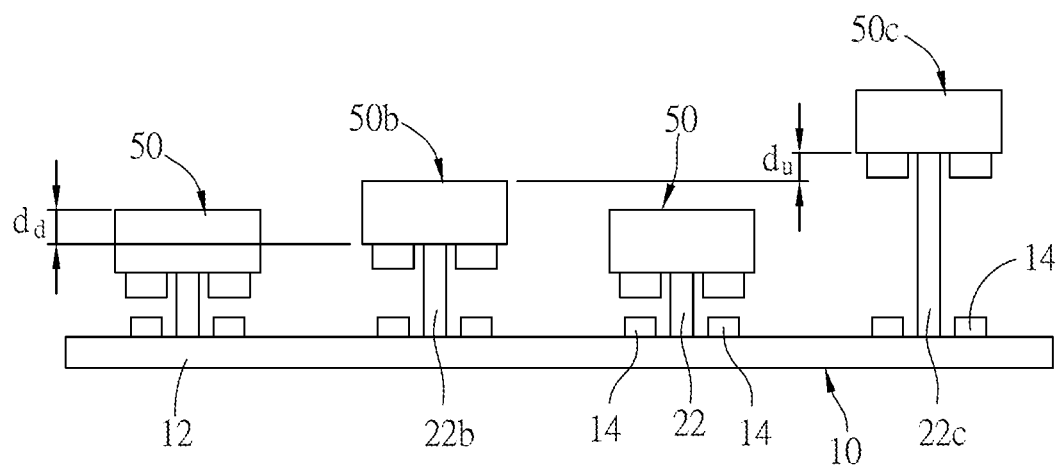

Then, referring to FIG. 6D, the steps S20 and S30 are performed to move the carrying device 40c away. The micro semiconductor structures 50b, which are picked up by the micro contact protrusions 22b, can remain the original pattern and positioned on the target substrate 10. In addition, the micro semiconductor structures 50c, which are picked up by the micro contact protrusions 22c, can also remain the original pattern and positioned on the target substrate 10.

The be noted, the term "next batch" is only with respect to the "previous batch" of the same step, and is not referred to "the similar or inferior batch" or "the same or other kinds".

To be noted, in all figures of this disclosure, the scales of the micro contact protrusions, comparing with the micro semiconductor structures and the target substrate, are for an illustration only, and are not to limit the scope of this disclosure.

Eighth Embodiment

Figure 6E:
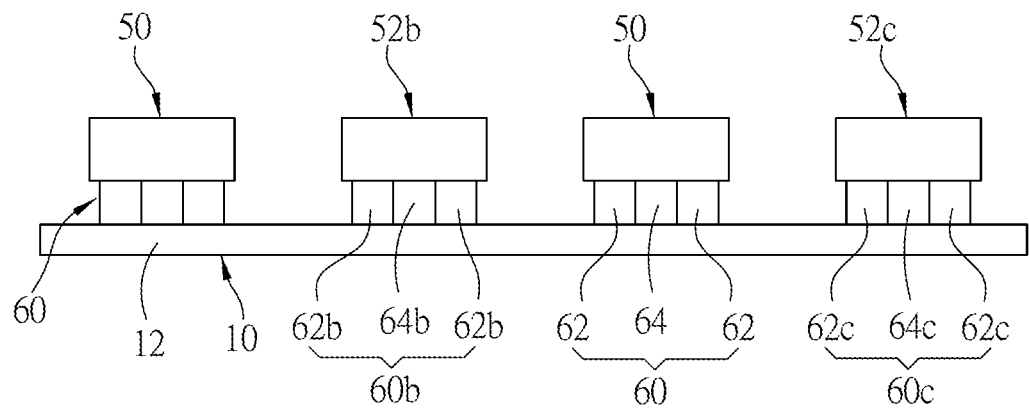
FIG. 6E is schematic diagram showing the step S40 in the eighth embodiment after finishing the steps of the seventh embodiment.

Referring to FIGS. 1E and 6E, the eighth embodiment is to perform the step S40 after finishing the steps of the seventh embodiment. The steps and components having similar instructions and functions have the same reference numbers of the seventh embodiment.

As shown in FIG. 6E, the step S40 is to apply a predetermined treatment on the target substrate 10, which is configured with the micro semiconductor structures 50, 50b and 50c in the seventh embodiment. Accordingly, the eutectic bonding can be performed between the conductive portions 14 and the corresponding electrodes 54, 54b and 54c, thereby forming the first connecting elements 62, 62b and 62c. In addition, the micro contact protrusions 22, 22b and 22c can form the second connecting elements 64, 64b and 64c.

Ninth Embodiment

Figure 7:
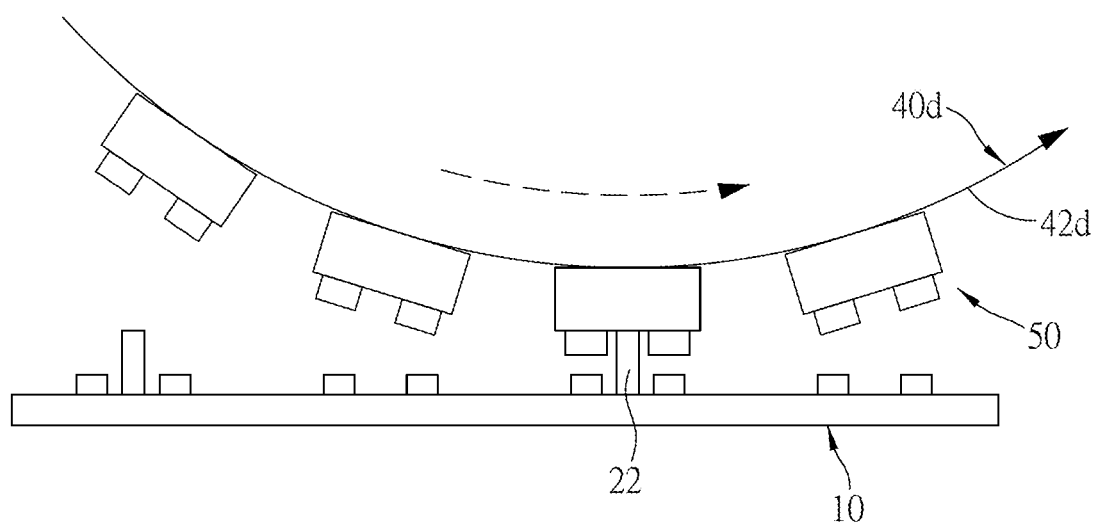
FIG. 7 is a schematic diagram showing the manufacturing process of a method of batch transferring micro semiconductor structures according to a ninth embodiment of this disclosure.

Different from the first to eighth embodiments, as shown in FIG. 7, the ninth embodiment provides another aspect of the carrying device, which comprises at least an attaching roller 40d. The steps and components having similar instructions and functions have the same reference numbers of the first to eighth embodiments.

As shown in FIG. 7, an attaching surface 42d is configured on the attaching roller 40d. In this embodiment, the attaching roller 40d comprises a planar attaching surface 42d, but this disclosure is not limited thereto. The attaching roller 40d can move the micro semiconductor structures 50 towards the target substrate 10, so that the patterned micro contact protrusions 22 of the target substrate 10 can pick up the micro semiconductor structures 50 in batch from the attaching roller 40d.

Tenth Embodiment

Figure 8A:
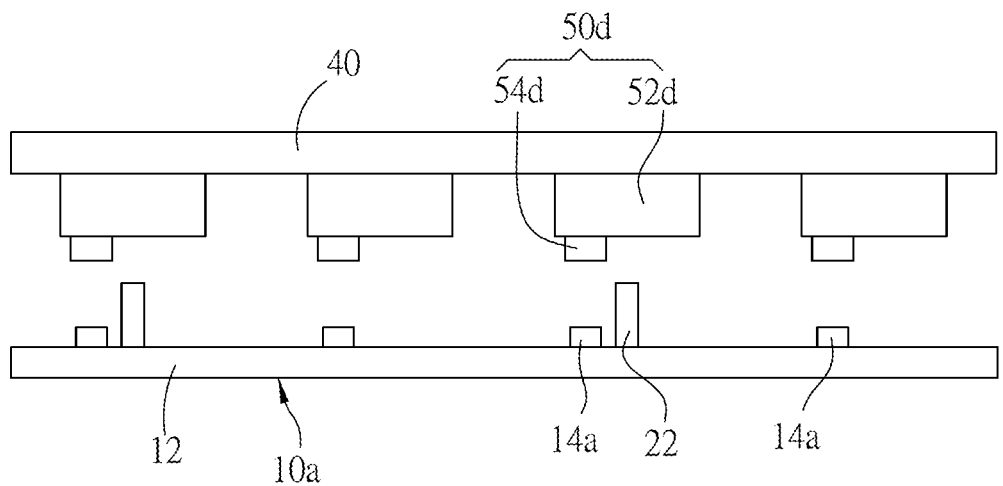
FIGS. 8A to 8C are schematic diagrams showing the manufacturing process of a method of batch transferring micro semiconductor structures according to a tenth embodiment of this disclosure.
Figure 8B:
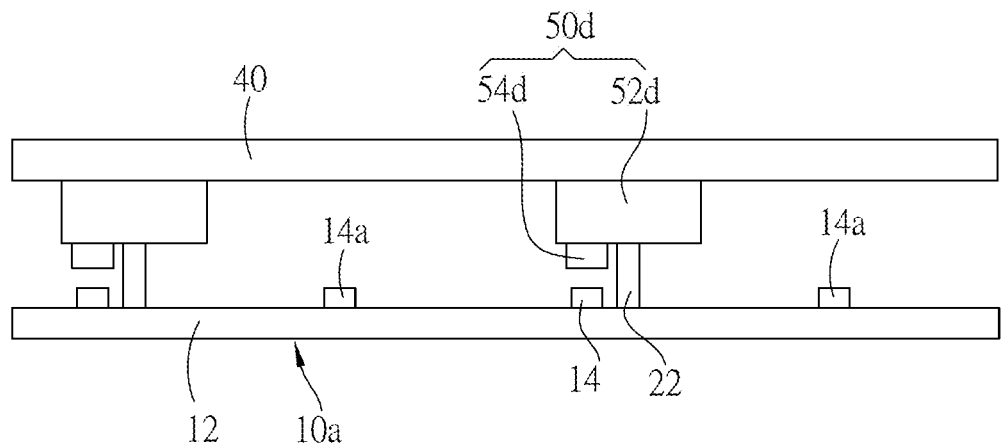
Figure 8C:
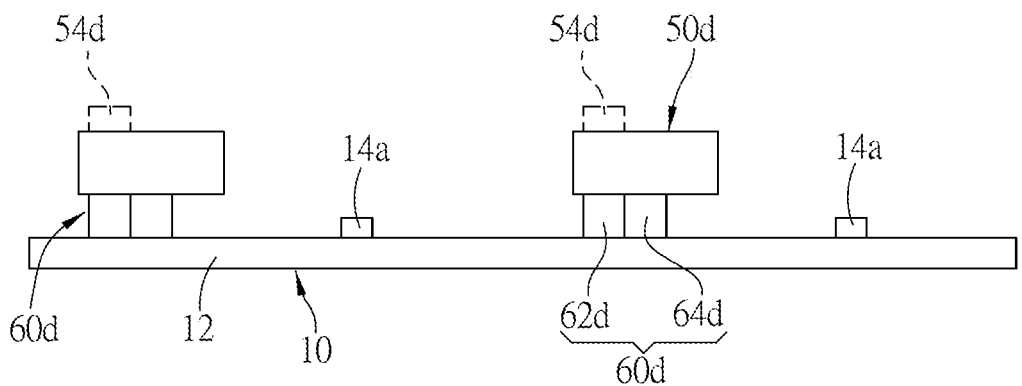

Different from the first to eighth embodiments, as shown in FIGS. 8A to 8C, the tenth embodiment transfers a plurality of vertical-electrode micro semiconductor structures 50d. The steps and components having similar instructions and functions have the same reference numbers of the first to eighth embodiments.

As shown in FIG. 8A, a carrying device 40 carries a plurality of micro semiconductor structures 50d, each of which comprises a main body 52d and a single electrode 54a disposed on the main body 52d. The target substrate 10a is defined with a plurality of conductive portions 14a, which are disposed corresponding to the single electrodes 54d of the micro semiconductor structures 50d. A plurality of patterned micro contact protrusions 22 are disposed on the target substrate 10a and located adjacent to the conductive portions 14a.

As shown in FIG. 8B, similarly, a plurality of patterned micro contact protrusions 22 are disposed on the target substrate 10a for picking up the micro semiconductor structures 50d in batch from the carrying device 40.

As shown in FIG. 8C, the eutectic bonding is performed between the conductive portions 14 and the corresponding electrodes 54d so as to form the first connecting elements 62d. In addition, the micro contact protrusions 22d directly form the second connecting elements 64d. Afterwards, it is possible to form another electrode 54d (shown as the dotted lines) on the other side of the micro semiconductor structure 50d.

In this disclosure, the term "batch transferring" is to select and transfer at least a part of at least one row of the micro semiconductor structures 20. In some embodiments, "batch transferring" can be to select and transfer a plurality of rows of micro semiconductor structures 20, to select and transfer a part of a row of micro semiconductor structures 20, to select and transfer a part of a plurality of rows of micro semiconductor structures 20, or any combination of the above. These examples are for illustrations only and not to limit the explanation of the term "batch transferring" or "picking up in batch".

The present disclosure is to form a plurality of patterned micro contact protrusions on the target substrate for selectively picking up a plurality of micro semiconductor structures in batch. By adjusting the height of the micro contact protrusions, the carrying device can have a planar attaching surface, so that the multiple attaching surfaces with different depths are not necessary. This configuration can reduce the cost for satisfying the preciseness requirement of the carrying device. However, the benefit provided by the disclosure is not to limit the scope of this disclosure. In other words, this disclosure can also be applied with the carrying device having multiple attaching surface with different depths.

In addition, this disclosure has additional aspects depending on the manufacturing process or working requirement. When the target substrate is a thin-film substrate, a predetermined treatment can be provided to transfer the micro semiconductor structures to the thin-film substrate. Then, the connecting structures can be formed between the target substrate and the micro semiconductor structures. The connecting structures comprise the first connecting elements and the second connecting elements. The first connecting elements are formed by eutectic bonding of the electrodes of the micro semiconductor structures and the conductive portions of the target substrate, and the second connecting elements are formed by thermal solidifying the micro contact protrusions.

Accordingly, a method of batch transferring micro semiconductor structures of this disclosure is used to effectively and efficiently pick up array-type micro semiconductor structures 50 (micro-scaled structures/devices) in batch or in a huge amount, and integrate them on to a target substrate 10 (non-native substrate). The present disclosure can not only be applied to the micro LED dies, devices or semi-finished products thereof, but also be widely applied to the transferring in batch or in huge amount of various micro semiconductor structures. Moreover, when the target substrate is a thin-film substrate, the present disclosure can provide a firmer connecting structures between the micro semiconductor structures and the thin-film substrate.

As mentioned above, the method of batch transferring micro semiconductor structures and the target substrate with micro semiconductor structures of this disclosure include, for example but not limited to, the following functions.

1. The batch selecting event happens in the step of transferring to the target substrate, so preciseness requirement for the carrying device can be lower. Therefore, the batch transferring of the semiconductor devices (including the micro semiconductor structures) becomes more flexible.

2. At least two kinds of connecting elements are formed between the semiconductor devices (including the micro semiconductor structures) and the target substrate. One kind of the connecting elements is formed by the micro contact protrusions, and the other kind of the connecting elements is formed by eutectic bonding. Therefore, the connection can be firmer.

3. In a single semiconductor device (including the micro semiconductor structure), when the micro contact protrusion is disposed between two electrodes of the semiconductor device, it can provide an insulation effect to the electrodes.

4. The disclosure can be used to select and transfer the ultra-thin, fragile and/or small devices without causing the damage of the devices.

5. The disclosure can efficiently and effectively transfer the semiconductor devices (including the micro semiconductor structures) in batch or in a huge amount on to the target substrate, and the disclosure can be widely applied to the transferring in batch or in a huge amount of semiconductor devices (including the micro semiconductor structures).

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A target substrate with micro semiconductor structures, comprising:
a target substrate having a substrate body and a plurality of conductive portions disposed on the substrate body;
a plurality of micro semiconductor structures patternedly disposed on the target substrate, wherein each of the micro semiconductor structures comprises a main body and at least a pair of electrodes disposed on the main body, and each of the electrodes is directly contacted and eutectic bonded with corresponding one of the conductive portions of the target substrate excluding a solder between the electrode and the conductive portion; and a plurality of micro contact protrusions connecting the main bodies of the patterned micro semiconductor structures to the substrate body of the target substrate, wherein with respect to the pair of the electrodes of one of the micro semiconductor structures, a zone is between the pair of the electrodes, at least one part of the micro contact protrusions is beyond the zone and at a periphery of the pair of the electrodes;

wherein each of the micro semiconductor structures is a single structure excluding semiconductor package.

2. The target substrate with micro semiconductor structures according to claim 1, wherein the micro contact protrusions are disposed around the corresponding conductive portions at the periphery of the pair of the electrodes.

3. The target substrate with micro semiconductor structures according to claim 1, wherein the micro contact protrusions are continuously or discontinuously disposed.

4. The target substrate with micro semiconductor structures according to claim 1, wherein one part of the micro contact protrusions is disposed between the pair of the electrodes of each of the micro semiconductor structures.

5. The target substrate with micro semiconductor structures according to claim 1, wherein the micro contact protrusions are not disposed at the zone between the pair of the electrodes of each of the micro semiconductor structures.

6. The target substrate with micro semiconductor structures according to claim 1, wherein the micro semiconductor structures are horizontal-electrode or flip-chip micro LED dies.

7. The target substrate with micro semiconductor structures according to claim 1, wherein the micro semiconductor structures are vertical-electrode micro LED dies.

8. The target substrate with micro semiconductor structures according to claim 1, wherein the micro contact protrusions connect the main bodies of the patterned micro semiconductor structures to the substrate body of the target substrate before each of the electrodes is eutectic bonded with corresponding one of the conductive portions of the target substrate.

9. The target substrate with micro semiconductor structures according to claim 1, wherein with respect to one of the electrodes, at least one of the micro contact protrusions is disposed surrounding the one of the electrodes.

10. The target substrate with micro semiconductor structures according to claim 1, wherein each of the electrodes is restricted by the micro contact protrusion to be beside the micro contact protrusion, directly contacted and eutectic bonded with corresponding one of the conductive portions of the target substrate excluding a solder between the electrode and the conductive portion.

11. The target substrate with micro semiconductor structures according to claim 10, wherein a space at the zone between the pair of the electrodes is fully filled with a corresponding one of the micro contact protrusions.

12. A target substrate with micro semiconductor structures, comprising:
a target substrate;
a plurality of micro semiconductor structures disposed on the target substrate; and
a first connecting element and a second connecting element connecting the micro semiconductor structures to the target substrate;

wherein the target substrate has a substrate body and a plurality of conductive portions disposed on the substrate body, and each of the micro semiconductor structures comprises a main body and at least a pair of electrodes disposed on the main body;

wherein the first connecting element excludes a solder and is formed from directly connecting and eutectic bonding the electrode of each of the micro semiconductor structures with corresponding one of the conductive portions of the target substrate; and wherein the second connecting element connects the main bodies of the micro semiconductor structures to the substrate body of the target substrate, and the second connecting element is formed by at least a micro contact protrusion, wherein with respect to the pair of the electrodes of one of the micro semiconductor structures, a zone is between the pair of the electrodes, at least one part of the second connecting element is beyond the zone and at a periphery of the pair of the electrodes;

wherein each of the micro semiconductor structures is a single structure excluding semiconductor package.

13. The target substrate with micro semiconductor structures according to claim 12, wherein the micro contact protrusions are disposed around the corresponding conductive portions at the periphery of the pair of the electrodes.

14. The target substrate with micro semiconductor structures according to claim 12, wherein the micro contact protrusion is continuously or discontinuously disposed.

15. The target substrate with micro semiconductor structures according to claim 12, wherein with respect to the corresponding one of the conductive portions, the micro contact protrusion is disposed surrounding the corresponding one conductive portion.

16. The target substrate with micro semiconductor structures according to claim 12, wherein one part of the micro contact protrusions is disposed between the pair of the electrodes of each of the micro semiconductor structures.

17. The target substrate with micro semiconductor structures according to claim 12, wherein the second connecting element connects the main bodies of the micro semiconductor structures to the substrate body of the target substrate before the first connecting element is formed from eutectic bonding the electrode of each of the micro semiconductor structures with corresponding one of the conductive portions of the target substrate.

18. The target substrate with micro semiconductor structures according to claim 12, wherein the second connecting element is not disposed at the zone between the pair of the electrodes of each of the micro semiconductor structures.

19. The target substrate with micro semiconductor structures according to claim 12, wherein the first connecting element excludes a solder and is restricted by the second connecting element to be beside the second connecting element and formed from directly connecting and eutectic bonding the electrode of each of the micro semiconductor structures with corresponding one of the conductive portions of the target substrate.

20. The target substrate with micro semiconductor structures according to claim 19, wherein a space at the zone between the pair of the electrodes is fully filled with the second connecting element.

* * * * *